United States Patent
Hsu et al.

(10) Patent No.: US 8,486,834 B2
(45) Date of Patent: Jul. 16, 2013

(54) METHOD FOR MANUFACTURING MEMORY DEVICE

(75) Inventors: Ping Hsu, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 253 days.

(21) Appl. No.: 13/115,039

(22) Filed: May 24, 2011

(65) Prior Publication Data
US 2012/0302060 A1  Nov. 29, 2012

(51) Int. Cl.
*H01L 21/768* (2006.01)
(52) U.S. Cl.
USPC .................................. 438/675; 257/E21.585
(58) Field of Classification Search
USPC .................... 438/689–692, 758–761, 770, 84, 438/674, 675
See application file for complete search history.

(56) References Cited

U.S. PATENT DOCUMENTS

| | | | | |
|---|---|---|---|---|
| 6,184,129 B1 * | 2/2001 | Hwang et al. | | 438/653 |
| 6,573,174 B2 * | 6/2003 | Suh et al. | | 438/637 |
| 2007/0275555 A1 * | 11/2007 | Kim | | 438/637 |
| 2010/0124817 A1 * | 5/2010 | Kim et al. | | 438/586 |
| 2011/0143509 A1 * | 6/2011 | Fujimoto | | 438/270 |

* cited by examiner

*Primary Examiner* — Savitr Mulpuri

(57) ABSTRACT

The disclosure provides a method for manufacturing a memory device, including: providing a plurality of gate structures formed on a substrate, wherein the gate structures comprise a cap layer disposed on the top of the gate structure, and each two adjacent gate structures are separated by a gap; blanketly forming a polysilicon layer on the substrate to fill the gap; performing a planarization process to the polysilicon layer, obtaining a polysilicon plug; and performing an oxidation process after the planarization process, converting a part of the polysilicon plug and a residual polysilicon layer over the gate structure to silicon oxide.

7 Claims, 6 Drawing Sheets

METHOD FOR MANUFACTURING MEMORY DEVICE

BACKGROUND

1. Technical Field

The present invention relates to a method for manufacturing a memory device, and more particularly, to a method for manufacturing a memory device which avoids bit line to bit line shorts.

2. Description of the Related Art

There are a lot of contact holes formed during the formation of a DRAM, including bit line contact holes, substrate contact holes and gate contact holes. Through these contact holes, conductive wires can be formed to connect the drains, substrates and gates.

In 0.11-um CMOS processing, the width of a bit line contact hole is about 140 nm to 160 nm, and the pitch of the bit line is about 220 nm. Therefore, with miniaturization of devices, the distance between each two bit lines, between each two bit line contact holes, or between a bit line and a bit line contact hole is becoming more and more shorter, which easily causes the electric shorts and consequently results in leakage. For example, the scratches caused by chemical mechanical polishing, the stringers in the poly-silicon layer, or the offset of the bit line contact hole might produce shorts, such as bit line to bit line shorts.

FIGS. 1-2 illustrate a conventional method for manufacturing a memory device. As shown in FIG. 1, a plurality of gate structures 12 is formed on a substrate 10. The gate structure includes a cap nitride layer 14, a gate conductor 16, a gate dielectric layer 20, and a spacer 18, wherein two adjacent gate structures 12 are separated by a gap 22. Next, a polysilicon layer 24 is blanketly formed on the substrate 10 to fill the gap 22. As shown in FIG. 2, a chemical mechanical polishing (CMP) process is generally employed to remove the polysilicon layer 24 formed over the gate structure 12, forming polysilicon plugs 26. However, since the polysilicon layer formed over the gate structure 12 is not apt to be completely removed by chemical mechanical polishing, residual polysilicon may remain over the gate structure 12. Therefore, a poly stringer may be occurred, resulting in a bit-line to bit-line short after formation of a subsequent conductive layer to contact the polysilicon plugs 26.

In order to avoid the poly stringer problem, a conventional method discloses removal of the polysilicon layer 24 over the gate structure 12 via an over chemical-mechanical polishing (over CMP) process. The bit-line to bit-line short resulting from the poly stringer can be avoided by the aforementioned method. The over chemical-mechanical polishing (over CMP) process, however, undesirably removes a part of the cap nitride layer 14 (thinning the cap nitride layer), resulting in exposure of the gate conductor 16 after a subsequent etching process is conducted. Therefore, a word-line to bit-line short may be occurred after formation of a subsequent conductive layer is formed to contact with the polysilicon plugs 26.

Accordingly, a novel method for fabrication of a memory device which overcomes the above problems is desired.

SUMMARY

The disclosure provides a method for manufacturing a memory device, including: providing a plurality of gate structures formed on a substrate, wherein the gate structures comprise a cap layer disposed on the top of the gate structure, and each two adjacent gate structures are separated by a gap; blanketly forming a polysilicon layer on the substrate to fill the gap; performing a planarization process to the polysilicon layer, obtaining a polysilicon plug; and performing an oxidation process after the planarization process, converting a part of the polysilicon plug and a residual polysilicon layer over the gate structure to silicon oxide.

According to another embodiment of the disclosure, the method for manufacturing the memory device includes: providing a plurality of gate structures formed on a substrate, wherein the gate structures comprise a cap layer disposed on the top of the gate structure, and each two adjacent gate structures are separated by a gap; blanketly forming a polysilicon layer on the substrate to fill the gap; performing a planarization process to the polysilicon layer, obtaining a polysilicon plug; performing an oxidation process after the planarization process, converting a part of the polysilicon plug and a residual polysilicon layer over the gate structure to silicon oxide; forming a patterned photoresist layer on the oxide layer, exposing the top surface of the oxide layer directly over the polysilicon plug; forming a patterned photoresist layer on the oxide layer exposes the top surface of the oxide layer directly over the polysilicon plug; etching the oxide layer with the patterned photoresist layer as a mask, exposing the top surface of the polysilicon plug; and forming a conductive layer to electrically connect with the polysilicon plug.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

FIGS. 3-10 are cross sections showing a conventional method for manufacturing a memory device according to an embodiment of the disclosure.

Figure 1:
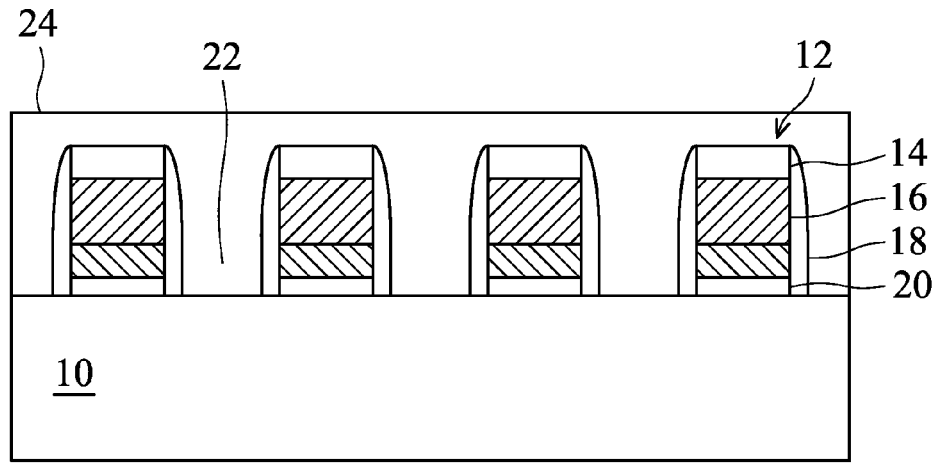
FIGS. 1 and 2 are cross sections showing a conventional method for manufacturing a memory device.
Figure 2:
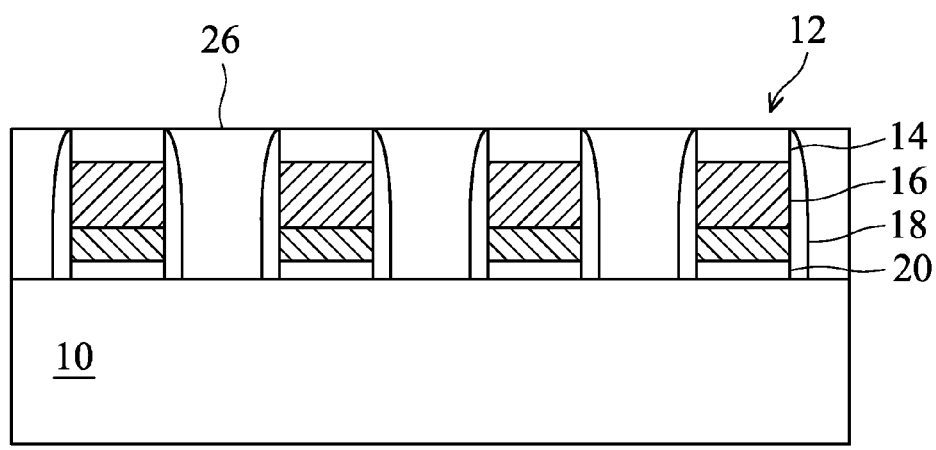
Figure 3:
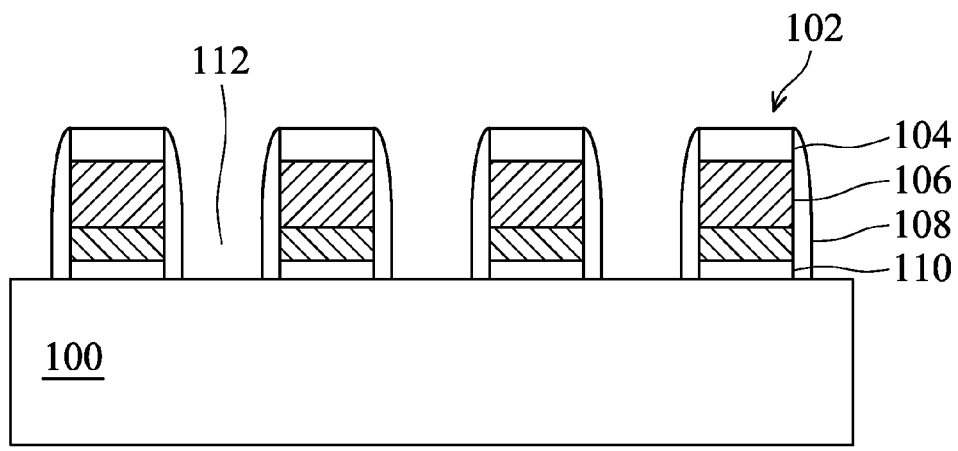
FIGS. 3-10 are cross sections showing a method for manufacturing a memory device according to an embodiment of the disclosure.

First, as shown in FIG. 3, a substrate 100 is provided, and a plurality of gate structures 102 is formed on a substrate 100. The substrate 100 can be a substrate including various elements embedded therein, and the accompanying drawings show the substrate 100 in a plain rectangular viewpoint in order to simplify the illustrations. The gate structure 102 can include a gate dielectric layer 110 disposed on the substrate 100, a gate conductor 106 disposed on he gate dielectric layer 110, a cap layer 104 disposed on the gate conductor 106, and a spacer 108 covering the side walls of the cap nitride layer 104 and the gate conductor 106. The cap layer 104 and the spacer 108 can both be a silicon nitride layer. Particularly, the two adjacent gate structures 102 are separated by a gap 112.

Figure 4:
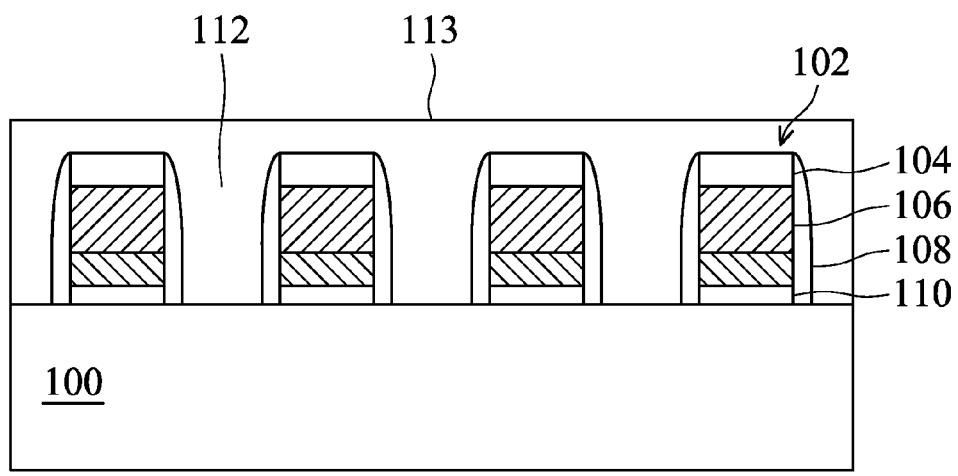

Next, as shown in FIG. 4, a polysilicon layer 113 is blanketly formed on the substrate 100 to fill the gap 112.

Figure 5:
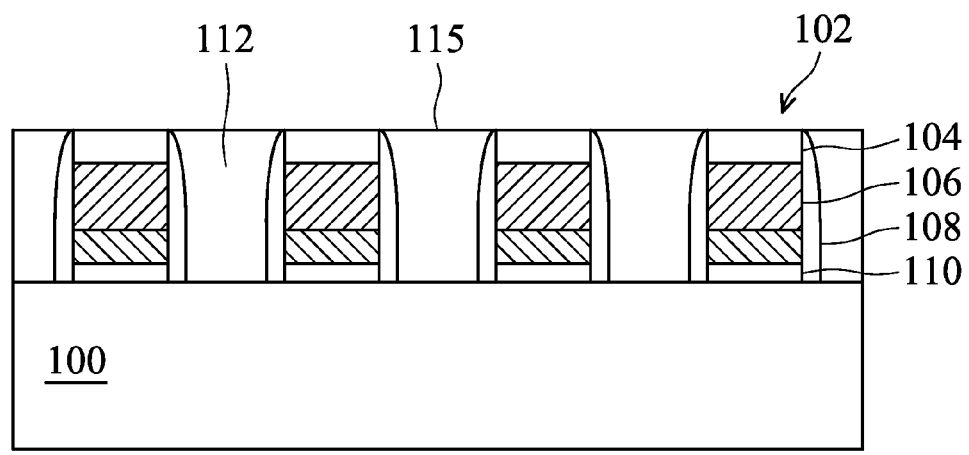

Next, as shown in FIG. 5, a planarization process (such as a chemical mechanical polishing (CMP)) is employed to remove the polysilicon layer 112 formed directly over the gate structure 102 with the cap layer 104 as stop layer, leaving polysilicon plugs 115. It should be noted that, since there is no over chemical-mechanical polishing (over CMP) process employed to remove the polysilicon layer 112 formed directly over the gate structure 102, the cap layer 104 is not damaged by the chemical mechanical polishing process and has a sufficient thickness for preventing the gate conductor 106 from directly contacting with a conductive layer which is to be subsequently formed.

Figure 6:
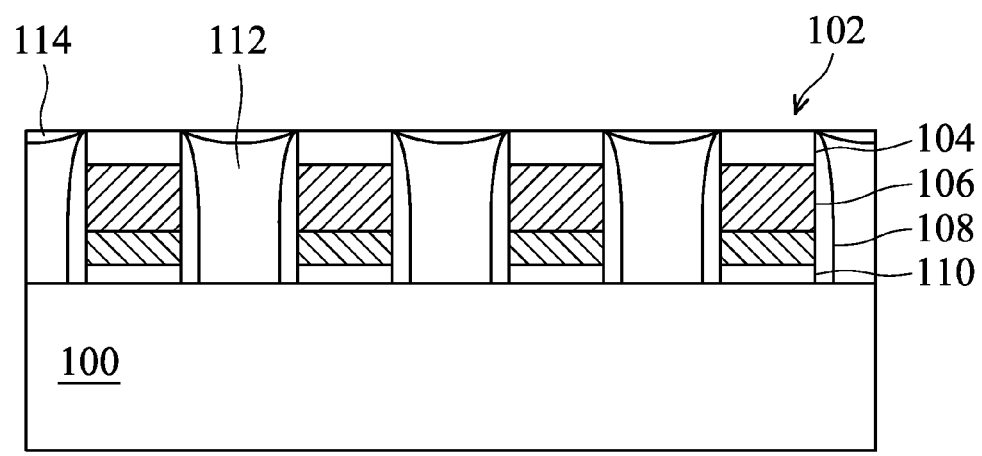

Next, as shown in FIG. 6, in order to eliminate the poly stringer problem, one key feature of the disclosure performs an oxidation process after the planarization process to convert a residual polysilicon layer over the gate structure (remaining on the gate structure 102 after the planarization process) to silicon oxide. There is no residual polysilicon layer over the gate structure (poly stringer). Further, during the oxidation process, the top portion of the polysilicon plug 115 is also converted to the silicon oxide 114. Therefore, a subsequently formed conductive layer (formed to contact with the corresponding polysilicon plug 115) does not cause a bit-line to bit-line contact.

Figure 7:
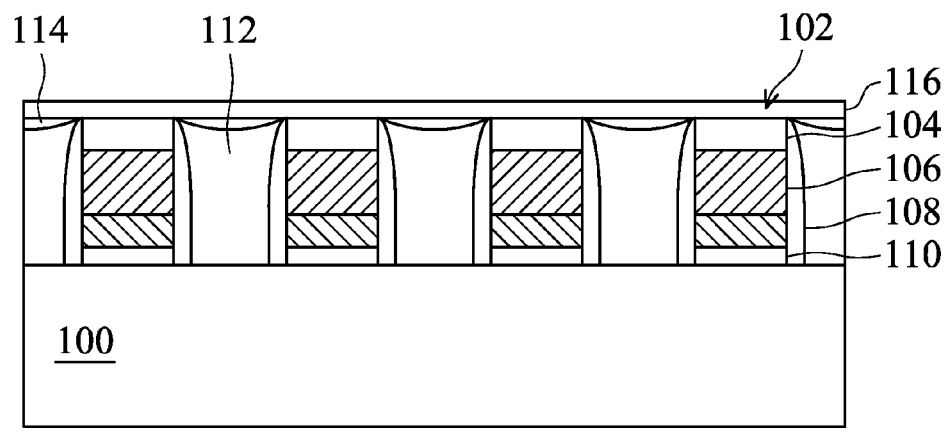

Next, as shown in FIG. 7, an oxide layer 116 can be further formed on the substrate 100 to ensure that the cap layer 104 is not damaged after a subsequent etching process performed.

Figure 8:
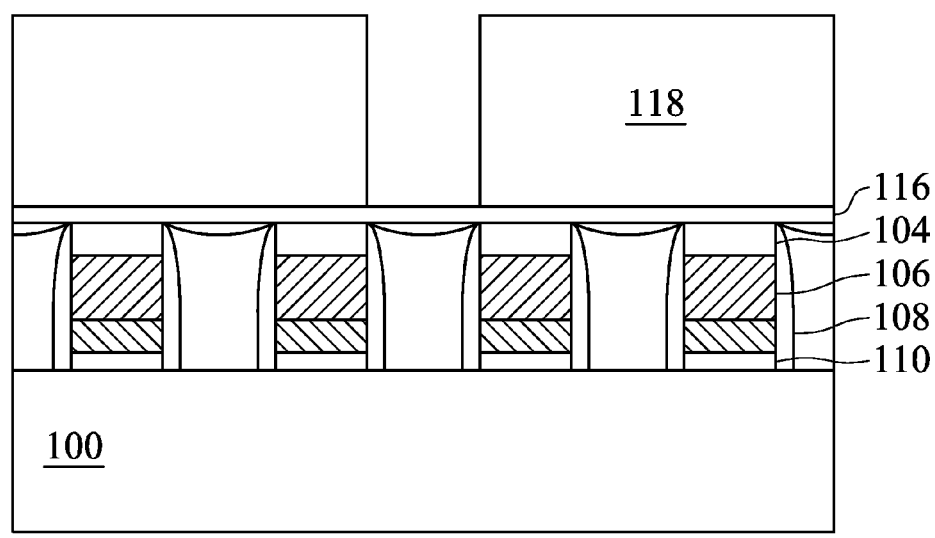

Next, as shown in FIG. 8, a patterned photoresist 118 is formed on the oxide layer 116, exposing the top surface of the oxide layer 116 which is directly disposed over the polysilicon plug 115.

Figure 9:
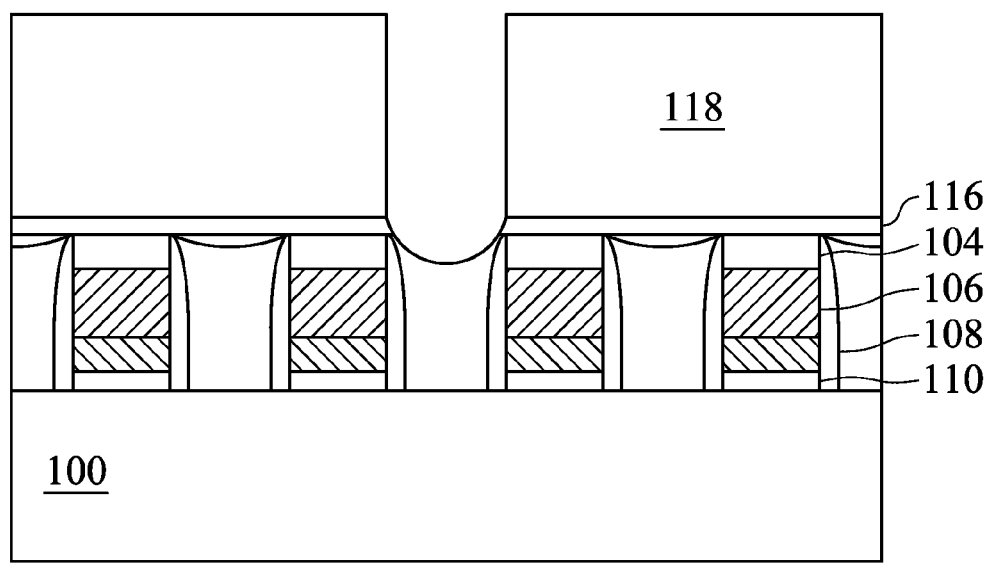

Next, as shown in FIG. 9, an etching process is performed to the oxide layer with the patterned photoresist as a mask, exposing the remaining polysilicon plug 115. Since the cap layer 104 is not removed during the planarization process, the gate conductor 106 is completely covered and is not exposed after the etching process is completed.

Figure 10:
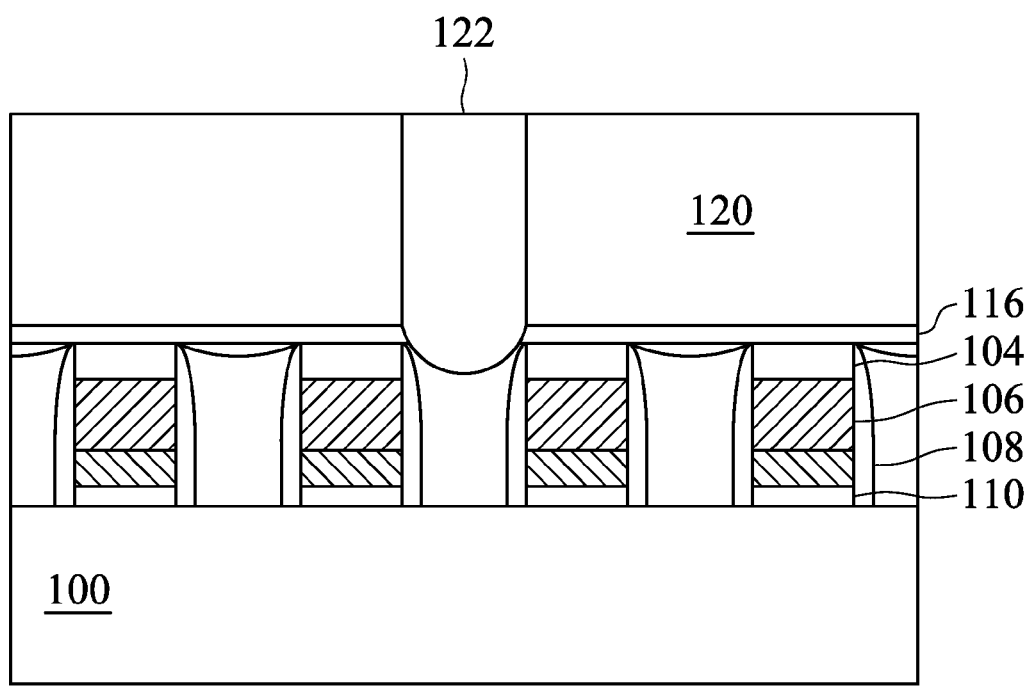

Next, as shown in FIG. 10, the photoresist 118 is removed and a pattered dielectric layer is formed on the dielectric layer. Finally, still referring to FIG. 10, a conductive layer 120 is formed to electrically connect with the polysilicon plug 115. It should be noted that the cap layer 104 is not removed by the chemical mechanical polishing process and has a sufficient thickness, thereby avoiding the bit-line to gate conductor short.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing a memory device, comprising:
   providing a plurality of gate structures formed on a substrate, wherein the gate structures comprise a cap layer disposed on the top of the gate structure, and each two adjacent gate structures are separated by a gap;
   blanketly forming a polysilicon layer on the substrate to fill the gap;
   performing a planarization process to the polysilicon layer, obtaining a polysilicon plug;
   performing an oxidation process after the planarization process, converting a part of the polysilicon plug and a residual polysilicon layer over the gate structure to silicon oxide;
   forming an oxide layer on the substrate after performing the oxidation process;
   forming a patterned photoresist layer on the oxide layer, exposing the top surface of the oxide layer directly over the polysilicon plug etching the oxide layer with the patterned photoresist layer as a mask, exposing the top surface of the polysilicon plug; and forming a conductive layer to electrically connect with the polysilicon plug.

2. The method as claimed in claim 1, wherein the gate structure further comprises a gate conductor disposed under the cap layer.

3. The method as claimed in claim 2, wherein the gate structure further comprises a spacer covering a side wall of the gate conductor.

4. The method as claimed in claim 1, wherein the planarization process is performed without removing the cap layer.

5. The method as claimed in claim 1, wherein the cap layer is a cap nitride layer.

6. The method as claimed in claim 1, wherein the planarization process comprises a chemical mechanical polishing process.

7. The method as claimed in claim 1, wherein the oxide layer comprises a silicon oxide layer.

\* \* \* \* \*